United States Patent [19]

Myslinski

[11] Patent Number: 5,477,129

[45] Date of Patent: Dec. 19, 1995

[54] CHARGE LEVEL DISPLAY METHOD AND APPARATUS FOR A BATTERY OF AN ELECTRONIC DEVICE

[75] Inventor: Theodore A. Myslinski, Freehold, N.J.

[73] Assignee: NCR Corporation, Dayton, Ohio

[21] Appl. No.: 155,662

[22] Filed: Nov. 22, 1993

[51] Int. Cl.$^6$ .............................. G01N 27/416; H02J 7/00
[52] U.S. Cl. ............................. 320/48; 324/426; 324/436; 340/636
[58] Field of Search ................................. 320/2, 43, 44, 320/48; 340/636; 324/425, 426, 427, 435

[56] References Cited

U.S. PATENT DOCUMENTS

| | | | |
|---|---|---|---|
| D. 33,979 | 9/1993 | Kelly et al. .............................. | D14/106 |
| D. 339,113 | 9/1993 | Kelly et al. .............................. | D14/106 |
| 3,940,679 | 2/1976 | Brandwein et al. ...................... | 320/48 |
| 4,709,202 | 11/1987 | Koenck et al. ........................... | 320/43 |
| 4,716,354 | 12/1987 | Hacker ..................................... | 320/39 |
| 4,755,733 | 7/1988 | Laliberte .................................. | 320/15 |
| 4,800,336 | 1/1989 | Mikami et al. .......................... | 320/48 X |
| 4,827,220 | 5/1989 | Figh ......................................... | 324/426 |
| 5,027,294 | 6/1991 | Fakruddin et al. ...................... | 364/550 |
| 5,043,651 | 8/1991 | Tamura .................................... | 320/43 |
| 5,105,180 | 4/1992 | Yamada et al. .......................... | 340/636 |
| 5,107,196 | 4/1992 | Agreste, Jr. et al. ....................... | 320/2 |
| 5,124,627 | 6/1992 | Okada ....................................... | 320/44 |
| 5,130,658 | 7/1992 | Bohmer .................................... | 324/435 |
| 5,130,659 | 7/1992 | Sloan ....................................... | 324/435 |
| 5,159,258 | 10/1992 | Kolvites et al. ........................... | 320/14 |
| 5,226,540 | 7/1993 | Bradbury ................................. | 206/576 |

*Primary Examiner*—Peter S. Wong
*Assistant Examiner*—Robert Nappi
*Attorney, Agent, or Firm*—Paul J. Maginot

[57] ABSTRACT

A portable computer is positionable between an open condition in which an input device and an output device thereof is exposed to a user of the portable computer, and a closed condition in which the input device and the output device is protectively stowed within the portable computer, and further with the portable computer having an "on" state of operation and an "off" state of operation. The portable computer includes a battery, and a display for indicating charge levels of the battery, wherein the display is visible to the user in the open condition and in the closed condition. The portable computer further includes a mechanism for operating the display when the portable computer is in the "on" state of operation and in the "off" state of operation. Moreover, the display is operated to continuously indicate charge levels during the entire "on" state of operation as well as during the entire "off" state of operation.

13 Claims, 5 Drawing Sheets

FIG. 6

| CHARGE LEVEL ( IN % ) OF BATTERY PACK ( X ) | FIGURE WHICH SHOWS THE IMAGE DISPLAYED ON THE INDICATOR DURING CHARGING OF THE BATTERY PACK |
|---|---|
| X = 0 | FIG. 5A |
| 0 < X < 25 | FIG. 5B |
| 25 ≤ X < 50 | FIG. 5C |
| 50 ≤ X < 75 | FIG. 5D |
| 75 ≤ X < 100 | FIG. 5E |
| X = 100 | FIG. 5F |

FIG. 8

| CHARGE LEVEL ( IN % ) OF BATTERY PACK ( X ) | FIGURE WHICH SHOWS THE IMAGE DISPLAYED ON THE INDICATOR DURING DISCHARGING OF THE BATTERY PACK |
|---|---|
| 75 < X ≤ 100 | FIG. 7A |
| 50 < X ≤ 75 | FIG. 7B |
| 25 < X ≤ 50 | FIG. 7C |
| 5 < X ≤ 25 | FIG. 7D |
| 2 < X ≤ 5 | FIG. 7E |
| 0 ≤ X ≤ 2 | FIG. 7F |

CHARGE LEVEL DISPLAY METHOD AND APPARATUS FOR A BATTERY OF AN ELECTRONIC DEVICE

CROSS REFERENCE

Cross reference is made to copending U.S. patent application Ser. No. 08/056,081 (Attorney Docket No. 5476), filed May 3, 1993, and entitled "Method and Apparatus for Displaying a Charge Level of a Battery," which is assigned to the same assignee as the present invention.

BACKGROUND OF THE INVENTION

The present invention relates to a method and apparatus for displaying charge levels of a battery and, more particularly, to a method and apparatus for displaying charge levels of a battery which is connected to an electronic device to power operation of the electronic device.

There are many previously known designs for apparatus which display charge levels of a battery. For example, U.S. Pat. No. 5,130,659 describes a battery monitor which indicates the projected time until a battery reaches a lower threshold value indicative of the energy capacity of the battery. The battery monitor includes a microprocessor which iteratively reads the value of the battery voltage. The microprocessor then determines the rate of discharge of the battery and projects the future values of the battery voltage as well as the projected time at which the battery voltage attains the threshold voltage. This projected time is then displayed on a visual indicator, such as an LCD display. U.S. Pat. No. 5,043,651 discloses an apparatus having a rechargeable battery and a battery voltage detector which detects the output voltage of the battery to produce a detection signal when the output voltage falls below a predetermined threshold level. A controller stores a battery capacity value and accumulates the discharge of the battery to produce an accumulated capacity value. The controller also calculates a difference between the stored capacity value and the accumulated capacity value. Using the difference, a display displays the remaining charge value of the battery thereon. If the difference exceeds a predetermined value at a time the controller receives the detection signal, the controller changes the stored capacity value to a new capacity value. In addition, U.S. Pat. Nos. 3,940,679; 4,755,733; 4,827,220; 5,027,294; 5,105,180; 5,107,196; 5,124,627; 5,130,658; and 5,159,258 relate to other devices for displaying indicia of characteristics of a battery.

However, when a battery is connected to an electronic device, such as a portable computer, to power operation of the electronic device, it may sometimes be desirable to quickly acquire knowledge of the charge level of the battery during a period of non-use of the electronic device. This is true since batteries which power electronic devices, such as a portable computers, include Nickel Cadmium type batteries and Nickel Metal Hydride type batteries. These battery types have an inherent self-discharge characteristic whereby if the battery is left uncharged for a substantial amount of time (e.g. several days), it will lose a significant portion of its charge without the electronic device ever being turned "on". As a result, it is advantageous for a user to acquire knowledge of the charge level of the battery prior to using the electronic device after a period of non-use in order to determine if a recharge is imminently needed. However, in order to acquire knowledge of the charge level of the electronic device, the user will have to go through the process of turning "on" the electronic device and then viewing the charge level indicator in order to acquire knowledge of the charge level. This process may be very time consuming especially in electronic devices, such as portable computers, which must undergo an initial boot cycle each time the device is turned "on". Moreover, in the case where a portable computer is transported from stowed location to a remote site after a period of non-use, the only purpose for initially turning the device "on" and waiting for completion of the boot cycle at the stowed location would be to acquire knowledge of the existing charge level of the battery in order to determine if the battery is sufficiently charged to power operation of the portable computer at the remote location for a desired amount of time.

SUMMARY OF THE INVENTION

In accordance with one embodiment of the present invention, there is provided a portable computer which is positionable between an open condition in which an input device and an output device are exposed to a user of the portable computer, and a closed condition in which the input device and the output device is protectively stowed within the portable computer, and with the portable computer having an "on" state of operation and an "off" state of operation. The portable computer includes a battery, and a display for indicating charge levels of the battery, wherein the display is visible to the user in the open condition and in the closed condition. The portable computer further includes a mechanism for operating the display when the portable computer is in the "on" state of operation and in the "off" state of operation.

Pursuant to another embodiment of the present invention, there is provided a portable computer having an "on" state of operation and an "off" state of operation. The portable computer including a battery, and a display for indicating charge levels of the battery. The portable computer further including a mechanism for operating the display when the portable computer is in the "on" state of operation and in the "off" state of operation According to still another embodiment of the present invention, there is provided a method for displaying a charge level of a battery which is coupled to an electronic device to power operation of the electronic device. The method includes the steps of (1) displaying the charge level of the battery when the electronic device is in the "on" state of operation, and (2) displaying the charge level of the battery when the electronic device is in the "off" state of operation.

Pursuant to yet another embodiment of the present invention, there is provided a battery charge level indicator that displays charge levels of a battery which is coupled to an electronic device to power operation of the electronic device. The indicator includes a display for indicating a series of at least two different charge levels of the battery. The indicator further includes a mechanism for operating the display when the electronic device is in an "on" state of operation and in an "off" state of operation.

It is therefore an object of the present invention to provide a new and useful portable computer.

It is another object of the present invention to provide an improved portable computer.

It is still another object of the present invention to provide a new and useful method and apparatus for displaying a charge level of a battery.

It is yet another object of the present invention to provide an improved method and apparatus for displaying a charge level of a battery.

It is still yet another object of the present invention to provide a method and apparatus for displaying a charge level of a battery which is coupled to an electronic device, such as a portable computer, wherein a user of the electronic device is able to quickly acquire knowledge of the charge level of the battery during a period of non-use of the electronic device.

It is still another object of the present invention to provide a method and apparatus for displaying a charge level of a battery which is coupled to an electronic device, such as a portable computer, wherein a user of the electronic device is able to quickly acquire knowledge of the charge level of the battery in order to determine if a recharge is imminently needed.

It is still yet another object of the present invention to provide a method and apparatus for displaying a charge level of a battery which is coupled to an electronic device, such as a portable computer, wherein a user of the electronic device is able to quickly acquire knowledge of the charge level of the battery in an easy and convenient manner.

The above and other objects, features, and advantages of the present invention will become apparent from the following description and the attached drawings.

BRIEF DESCRIPTION OF THE DRAWINGS

FIG. 6 is a table presenting the variable "Figure which Shows the Image Displayed on the Indicator during Charging of the Battery Pack" as a function of the variable "Charge Level (in %) of the Battery Pack";

FIG. 8 is a table presenting the variable "Figure which Shows the Image Displayed on the Indicator during Discharging of the Battery Pack" as a function of the variable "Charge Level (in %) of the Battery Pack".

DETAILED DESCRIPTION OF THE PREFERRED EMBODIMENT

Figure 1:
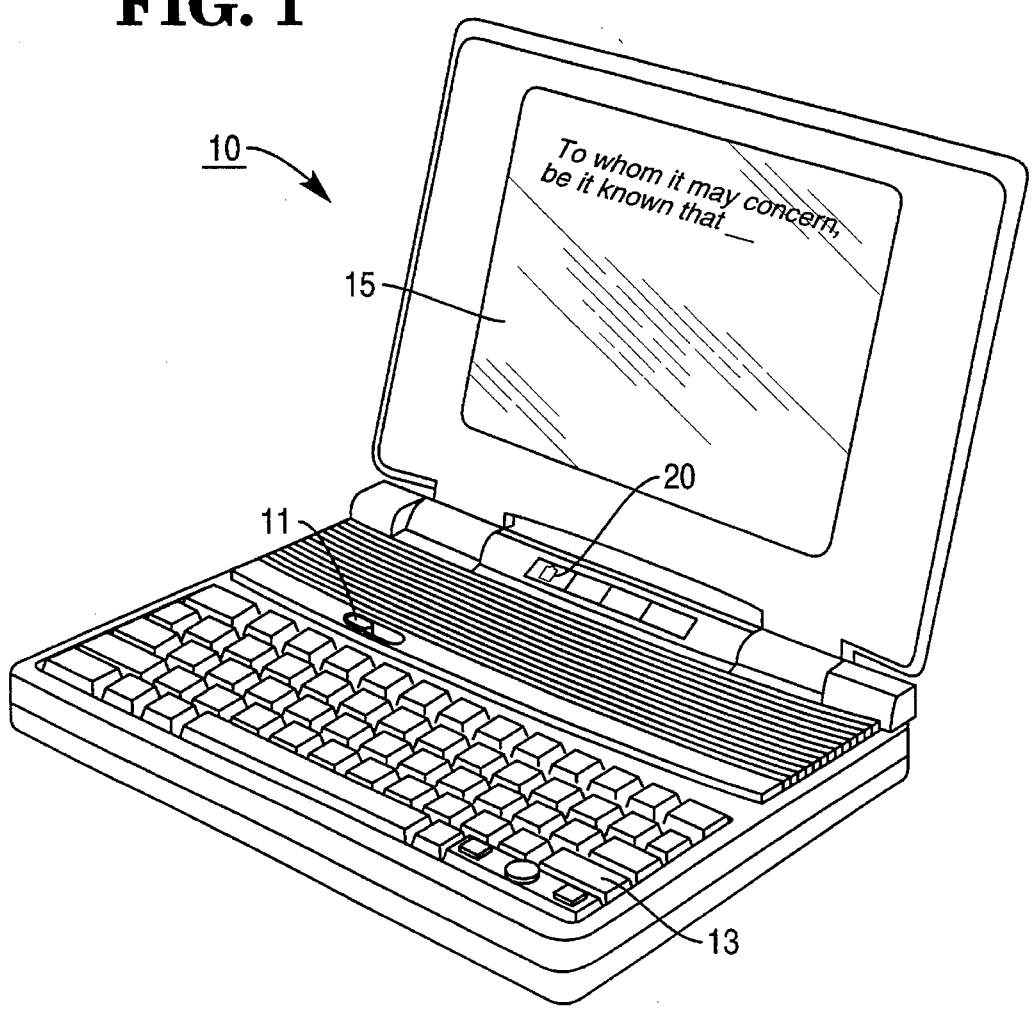
FIG. 1 is a perspective view of a portable computer incorporating the features of the present invention therein, with the portable computer shown in an open condition, and with an indicator shown as being visible to a user when the portable computer is in the open condition.

While the invention is susceptible to various modifications and alternative forms, a specific embodiment thereof has been shown by way of example in the drawings and will herein be described in detail. It should be understood, however, that it is not intended to limit the invention to the particular form disclosed, but on the contrary, the intention is to cover all modifications, equivalents, and alternatives falling within the spirit and scope of the invention as defined by the appended claims.

Figure 2:
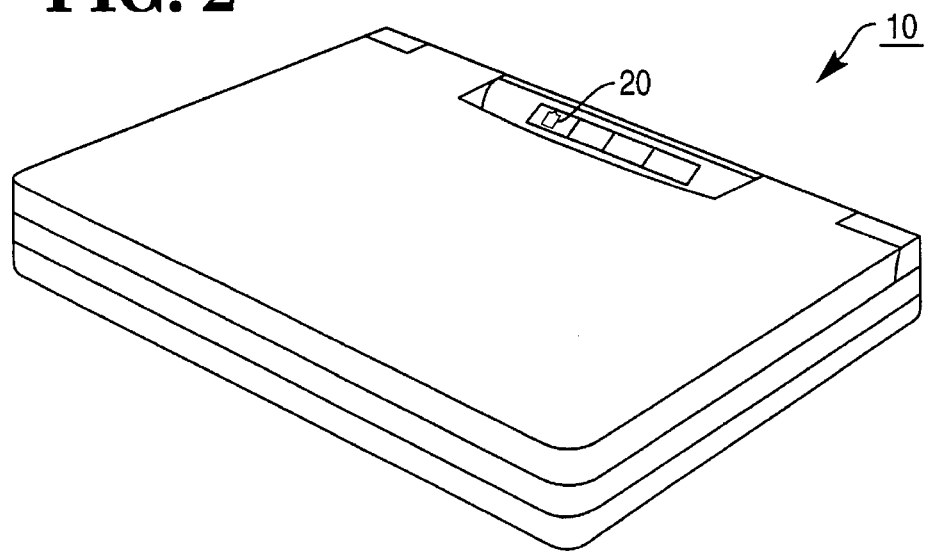
FIG. 2 is a perspective view of the portable computer of FIG. 1, with the portable computer shown in a closed condition, and with the indicator shown as being visible to a user when the portable computer is in the closed condition.
Figure 3:
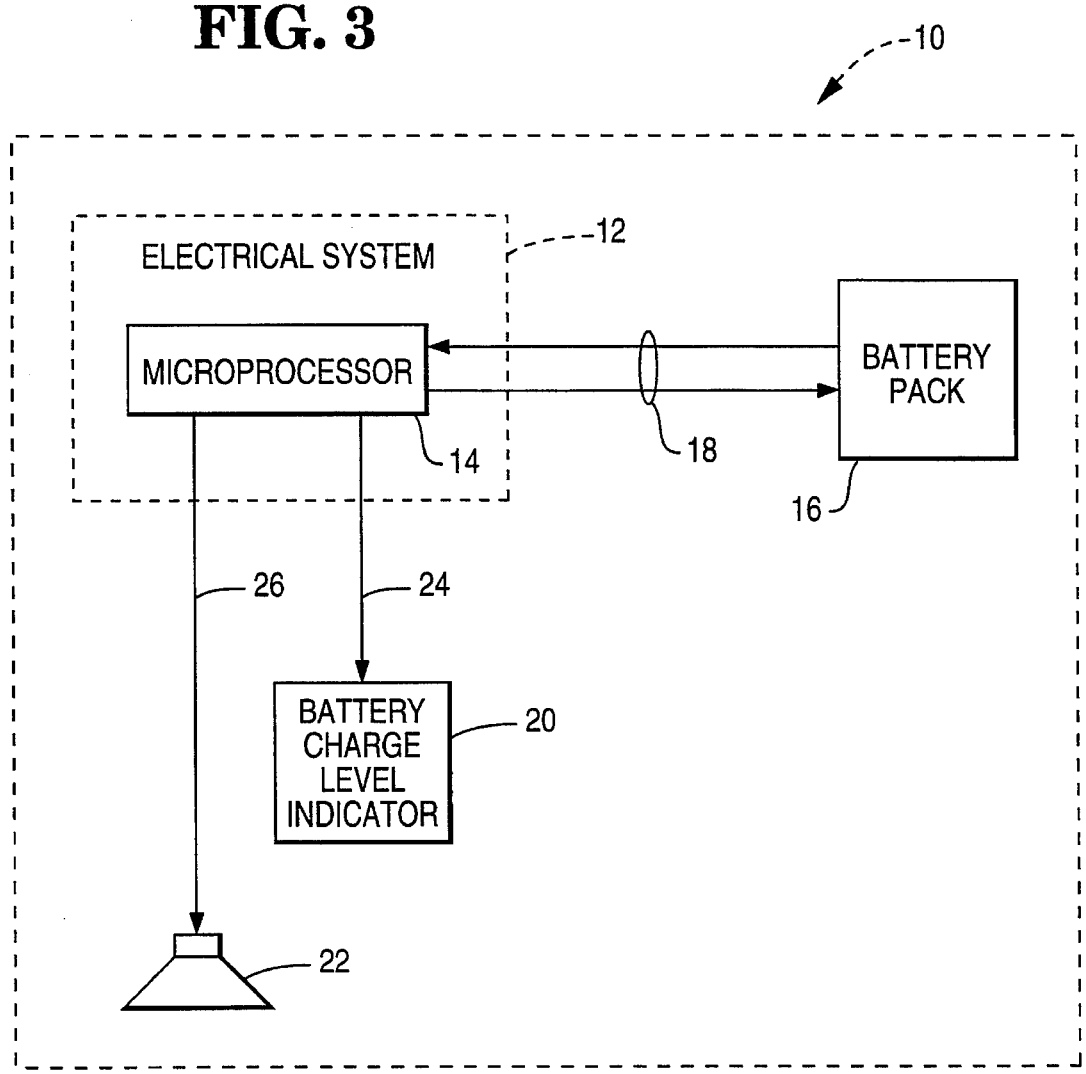
FIG. 3 is a block diagrammatic view of the portable computer of FIG. 1.

Referring now to FIGS. 1 and 2, there is shown a portable computer, generally indicated by the reference number 10, which incorporates the features of the present invention therein. The portable computer 10 has a clam shell-like configuration. The portable computer includes a battery charge level indicator 20. In FIG. 1, the portable computer 10 is shown in an open condition in which an input device 13 (i.e. a set of input keys 13) and an output device 15 (i.e. an output display screen 15) is exposed to a user of the portable computer. As shown in FIG. 1, the indicator 20 is visible to the user when the portable computer is positioned in the open condition. In FIG. 2, the portable computer 10 is shown positioned in a closed condition in which the set of input keys 13 and the output display screen 15 is protectively stowed within the housing of the portable computer. As shown in FIG. 2, the indicator 20 is also visible to the user when the portable computer is in the closed condition. FIG. 3 shows a block diagram of the portable computer 10. The portable computer 10 further includes an electrical system 12, a battery pack 16 and a loudspeaker 22. The electrical system 12 includes a microprocessor 14. The battery pack 16 includes a Nickel Cadmium type battery or a Nickel Metal Hydride type battery. The battery pack 16 is coupled via lines 18 to the microprocessor 14. The battery pack 16 includes a number of batteries plus circuitry which electrically communicates with the microprocessor 14. For example, the battery pack circuitry allows the microprocessor 14 to periodically poll the battery pack 16 in order to determine information regarding the charge level of the batteries contained in the battery pack. The indicator 20 is coupled via line 24 to the microprocessor 14 and interprets signals from the microprocessor so as to display information regarding the charge level of the batteries contained in the battery pack 16. Also, the loudspeaker 22 is coupled to the microprocessor 14 via line 26 and is activated so as to beep at predetermined times thereby indicating certain information regarding the charge level of the batteries contained in the battery pack.

Figure 4:
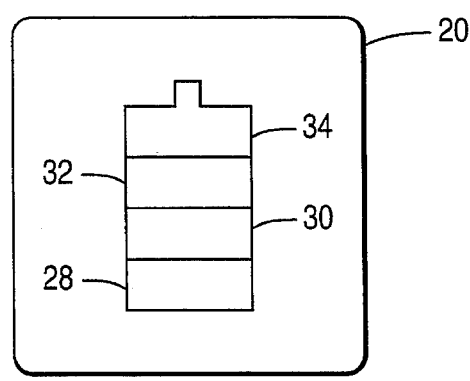
FIG. 4 is an enlarged elevational view of the indicator of the portable computer of FIG. 1.

The indicator 20 is shown in more detail in FIG. 4. In particular, the indicator 20 includes four LCD display segments 28, 30, 32 and 34 each which may be activated to display an image. When display segments 28, 30, 32 and 34 are simultaneously activated, a two dimensional image of a battery is created on the indicator 20.

The charge level of the battery pack 16 is displayed in a first manner during charging of the battery pack, and in a second manner which is different from the first manner, during discharging of the battery pack. The terms "charging of the battery pack", "charging of the battery", "battery pack charging", "battery charging" and "charge state of operation" are all used herein as meaning that the battery pack 16 is electrically coupled to a power source (not shown) so as to increase the total amount of electrical energy stored in the battery pack 16. Moreover, the terms "discharging of the battery pack", "discharging of the battery", "battery pack discharging", "battery discharging" and "discharge state of operation" are all used herein as meaning that the battery pack 16 is not electrically coupled to a power source and any electrical activity performed by the portable computer 10 causes a decrease in the total amount of electrical energy stored in the battery pack 16.

The first manner in which the charge level of the battery pack 16 is displayed includes operating the indicator 20 in a first mode during charging of the battery. The first mode of operating the indicator 20 is depicted in FIGS. 5A–5F. In FIGS. 5A–5F, each of the four LCD display segments may be shown as a solid display segment, or alternatively, a display segment filled with diagonal lines. For example, the display segment 28 is shown in FIG. 5B as a display segment filled with diagonal lines, and in FIG. 5C as a solid display segment. As used in FIGS. 5A–5F, a solid display segment indicates that the display segment is constantly activated, while a display segment filled with diagonal lines is periodically activated, or in other words, flashing. Therefore, the display segment 28 is flashing in FIG. 5B, while it is constantly activated in FIG. 5C.

Figure 5A:
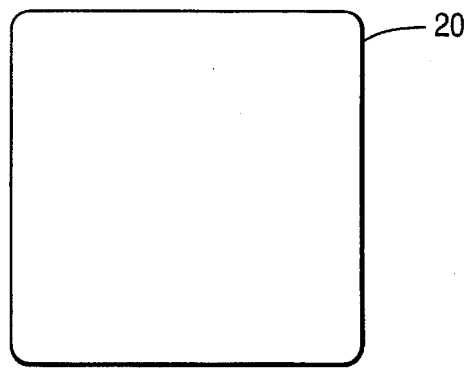
FIGS. 5A, 5B, 5C, 5D, 5E and 5F are each an enlarged elevational view of the indicator of the portable computer of FIG. 1 with each of the FIGS. 5A, 5B, 5C, 5D, 5E and 5F showing the indicator representing a certain charge level of the battery pack used in the portable computer of FIG. 1 during its charge state of operation.
Figure 5B:
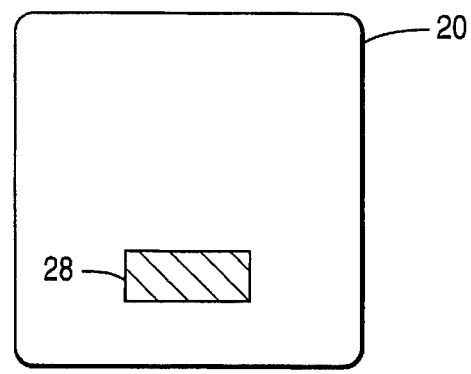
Figure 5C:
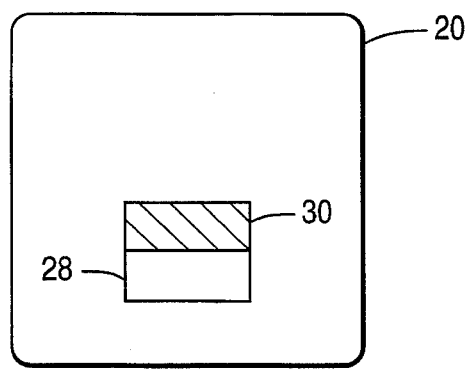
Figure 5D:
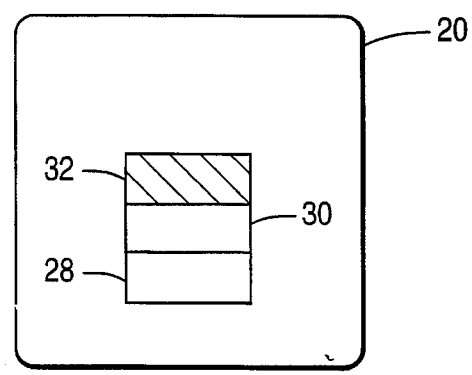
Figure 5E:
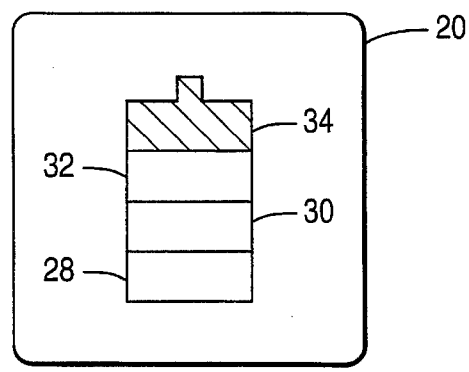
Figure 5F:
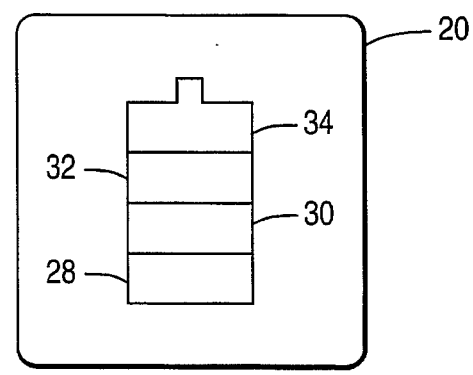

Again, the first manner in which the charge level of the battery pack 16 is displayed includes operating the indicator 20 in a first mode during charging of the battery and is depicted in FIGS. 5A–5F. Assuming that the battery pack 16 is substantially completely discharged, none of the four LCD display segments will be activated and the resulting image that is displayed on indicator 20 is depicted in FIG. 5A. As the battery pack 16 begins to charge, the resulting image that is displayed on the indicator 20 changes to the image depicted in FIG. 5B. This image will continue to be displayed on the indicator 20 until the charge level of the battery is 25% of full capacity. When the charge level of the battery increases to 25% of full battery capacity, the resulting image that is displayed on the indicator 20 changes to the image depicted in FIG. 5C. As the battery pack 16 further continues to charge, the image shown in FIG. 5C remains on the indicator 20 until the charge level of the battery is 50% of full capacity. When the charge level of the battery increases to 50% of full battery capacity, the resulting image that is displayed on the indicator 20 changes to the image depicted in FIG. 5D. As the battery pack 16 continues to charge, the image shown in FIG. 5D remains on the indicator 20 until the charge level of the battery is 75% of full capacity. When the charge level of the battery increases to 75% of full battery capacity, the resulting image that is displayed on the indicator 20 changes to the image depicted in FIG. 5E. As the battery pack 16 continues to charge, the image shown in FIG. 5E remains on the indicator 20 until the charge level of the battery is 100% of full capacity. When the charge level of the battery increases to 100% of full battery capacity, the resulting image that is displayed on the indicator 20 changes to the image depicted in FIG. 5F. A table presenting the variable "Figure which Shows the Image Displayed on the Indicator during Charging of the Battery Pack" as a function of the variable "Charge Level (in %) of the Battery Pack" is shown in FIG. 6.

Next, the second manner in which the charge level of the battery pack 16 is displayed includes operating the indicator 20 in a second mode during discharging of the battery. The second mode of operating the indicator 20 is depicted in FIGS. 7A–7F. In FIGS. 7A–7F, each of the four LCD display segments may be shown as a solid display segment, or alternatively, a display segment filled with crisscrossed lines. For example, the display segment 28 is shown in FIG. 7E as a display segment filled with crisscrossed lines, and in FIG. 7D as a solid display segment. As used in FIGS. 7A–7F, a solid display segment indicates that the display segment is constantly activated, while a display segment filled with crisscrossed lines is periodically activated, or in other words, flashing. Therefore, the display segment 28 is flashing in FIG. 7E, while it is constantly activated in FIG. 7D. However, the flash rate of a display segment that is filled with crisscrossed lines (see e.g., item 28 in FIG. 7E), as used herein, is twice as quick as the flash rate of a display segment that filled with diagonal lines (see e.g., item 28 in FIG. 5B). For example, if the display segment 28 of FIG. 5B was flashing at a rate of two displays per second, the display segment 28 of FIG. 7E would flash at a rate of four displays per second.

Figure 7A:
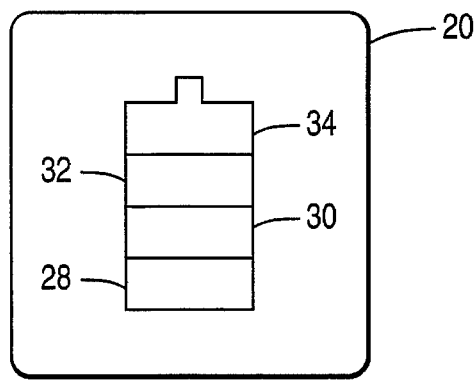
FIGS. 7A, 7B, 7C, 7D, 7E and 7F are each an enlarged elevational view of the indicator of the portable computer of FIG. 1 with each of the FIGS. 7A, 7B, 7C, 7D, 7E and 7F showing the indicator representing a certain charge level of the battery pack used in the portable computer of FIG. 1 during its discharge state of operation.
Figure 7B:
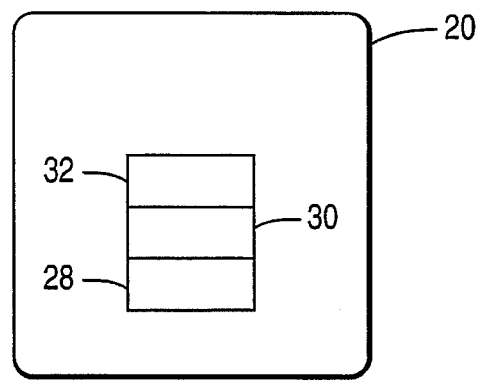
Figure 7C:
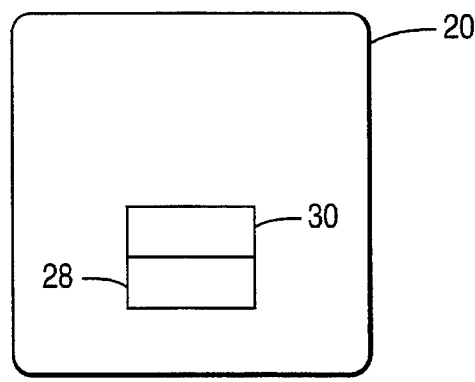
Figure 7D:
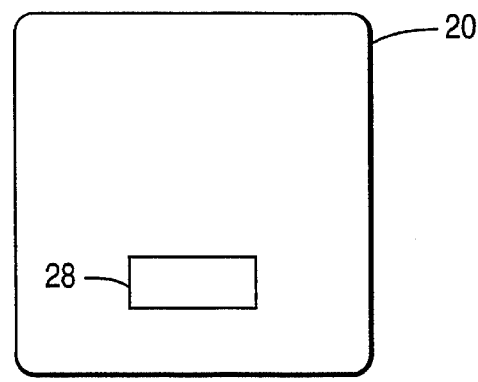
Figure 7E:
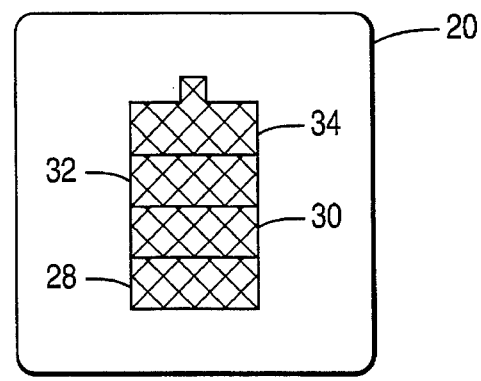
Figure 7F:
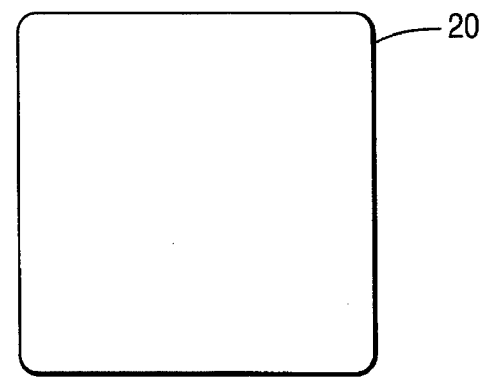

Again, the second manner in which the charge level of the battery pack 16 is displayed includes operating the indicator 20 in a second mode during discharging of the battery and is depicted in FIGS. 7A–7F. Assuming now that the battery pack 16 is completely charged (i.e. at 100% of full capacity), each of the four LCD display segments will be activated and the resulting image that is displayed on indicator 20 is depicted in FIG. 7A. When the battery pack 16 begins to discharge (due, for example, to electrical operation of the portable computer) the same image remains displayed on the indicator 20 as depicted in FIG. 7A. This image will continue to be displayed ion the indicator 20 until the charge level of the battery is 75% of full capacity. When the charge level of the battery decreases to 75% of full battery capacity, the resulting image that is displayed on the indicator 20 changes to the image depicted in FIG. 7B. As the battery pack 16 continues to discharge, the image as shown in FIG. 7B remains on the indicator 20 until the charge level of the battery is 50% of full capacity. When the charge level of the battery decreases to 50% of full battery capacity, the resulting image that is displayed on the indicator 20 changes to the image depicted in FIG. 7C. As the battery pack 16 continues to discharge, the image as shown in FIG. 7C remains on the indicator 20 until the charge level of the battery is 25% of full capacity. When the charge level of the battery decreases to 25% of full battery capacity, the resulting image that is displayed on the indicator 20 changes to the image depicted in FIG. 7D. As the battery pack 16 continues to discharge, the image as shown in FIG. 7D remains on the indicator 20 until the charge level of the battery is 5% of full capacity. When the charge level of the battery decreases to 5% of full battery capacity, the resulting image that is displayed on the indicator 20 changes to the image depicted in FIG. 7E. At this point, the microprocessor 14 activates the loudspeaker 22 so as to beep five times thereby indicating a critically low charge level of the battery pack 16. As the battery pack 16 continues to discharge, the image as shown in FIG. 7E remains on the indicator 20 until the charge level of the battery is 2% of full capacity. However, when the charge level of the battery decreases to 3% of full battery capacity, the microprocessor 14 again activates the loudspeaker 22 so as to beep ten times thereby indicating an even more critically low charge level of the battery pack 16. As the battery pack 16 continues to discharge and the charge level of the battery decreases to 2% of full battery capacity, all of the indicator segments 28, 30, 32 and 34 deactivate so that the resulting image that is displayed on the indicator 20 changes to the image depicted in FIG. 7F. Note that when the charge level of the battery decreases to 2% of full battery capacity, the portable computer 10 automatically deactivates so as to preserve the remaining electrical energy in the battery pack 16. A table presenting the variable "Figure which Shows the Image Displayed on the Indicator during Discharging of the Battery Pack" as a function of the variable "Charge Level (in %) of the Battery Pack" is shown in FIG. 6.

Referring again to FIGS. 1 and 2, the portable computer 10 possesses the following states: (1) an "on" state of operation, and (2) an "off" state of operation. The portable computer is shown in the "on" state of operation in FIG. 1, and the "off" state of operation in FIG. 2. A switch 11 is able to be actuated in order to switch the portable computer 10 between the "on" state of operation and the "off" state of operation. In the "on" state of operation, the portable computer functions to receive input information (e.g. from the set of input keys 13), to process information (e.g. the received input information) and to output information on the output display screen 15, as is well known in the art. Moreover, in the "on" state of operation, the portable computer functions so that the microprocessor 14 periodically polls the battery pack 16 in order to acquire information regarding the charge level of the batteries contained in the battery pack. This information is then used to continuously display an up-to-date charge level on the indicator 20. In the "off" state of operation, the portable computer is non-functional, as is well known in the art. Therefore, in this state, the portable computer is unable to receive input information (e.g. from the set of input keys 13), to process information (e.g. the received input information) and to output information on the output display screen 15. However, according to the present invention, the portable computer is still able to function during the "off" state of operation for a limited purpose so that the microprocessor 14 periodically polls the battery pack 16 in order to determine information regarding the charge level of the batteries contained in the battery pack. This information is then used to continuously display an up-to-date charge level on the indicator 20. In other words, the portable computer operates to display charge level information on the indicator 20 continuously during the "on" state of operation, as well as continuously during the "off" state of operation. However, once the charge level of the battery pack 16 decreases to 2% of full battery capacity, as described above, the portable computer switches from the "off" state of operation to an "inoperative" state whereby the portable computer discontinues display of the charge level of the battery pack on the indicator 20 in order to preserve the remaining electrical energy in the battery pack.

In the "on" state of operation, any electrical activity by the portable computer (such as processing input information) causes a decrease in the charge level of the battery pack 16. It should be noted that a decrease in the charge level of the battery pack 16 will also occur at a considerable rate even when the portable computer 10 is in the "off" state of operation. This is true due to the previously mentioned self-discharge characteristics of the batteries in the battery pack (i.e. the characteristics of Nickel Cadmium or Nickel Metal Hydride type batteries). The portable computer 10 of the present invention will continuously monitor this decreasing battery charge level during the "off" state of operation and continuously display such charge level on the indicator 20. For example, assuming the battery pack 16 is fully charged (i.e. at 100% of full capacity) and the portable computer is in the "off" state of operation, the portable computer 10 is able to continuously display the charge level of the battery pack on the indicator 20 from the fully charged condition (as shown in FIG. 7A) to the very critically low charged condition (as shown in FIG. 7E). As a result, if a user desires to commence use a portable computer which was stowed away for a period of time, a user of the portable computer 10 would not have to switch the portable computer to the "on" state of operation and wait for the boot cycle in order to acquire knowledge of the charge level of the battery pack. Rather, the user would be able to simply glance at the indicator 20 to acquire knowledge of the charge level of the battery pack and thereby quickly determine if a recharge is needed before beginning a new session of use with the portable computer.

While the invention has been illustrated and described in detail in the drawings and foregoing description, such illustration and description is to be considered as exemplary and not restrictive in character, it being understood that only the preferred embodiment has been shown and described and that all changes and modifications that come within the spirit of the invention are desired to be protected. For example, the present invention has been described as a method and apparatus that indicates the charge level of a battery pack which includes a number of batteries. The present invention is equally applicable to a method and apparatus which indicates the charge level of a single battery. In addition, the present invention has been described as a method and apparatus that indicates the charge level of a rechargeable battery pack. The present invention is equally applicable to a method and apparatus which indicates the charge level of a non-rechargeable battery pack such one which contains non-rechargeable Alkaline batteries.

What is claimed is:

1. A portable computer which is positionable between an open condition in which an input device and an output device are exposed to a user of the portable computer, and a closed condition in which the input device and the output device is protectively stowed within the portable computer, and with the portable computer having an "on" state of operation and an "off" state of operation, comprising:

a battery;

a display for indicating charge levels of said battery, wherein said display is visible to the user in the open condition and in the closed condition; and means for operating said display when the portable computer is in the "on" state of operation and in the "off" state of operation, wherein said operating means comprises a circuit which polls said battery, recurring at a regular interval of time, during the "off" state of operation of the portable computer in order to determine charge levels of said battery.

2. The portable computer of claim 1, wherein said display continuously indicates charge levels during the entire "off" state of operation.

3. The portable computer of claim 2, wherein said battery is discharging when the portable computer is in the "off" state of operation.

4. A portable computer having an "on" state of operation and an "off" state of operation, comprising:

a battery;

a display for indicating charge levels of said battery; and means for operating said display when the portable computer is in the "on" state of operation and in the "off" state of operation, wherein said display continuously indicates the charge levels during the entire "off" state of operation of the portable computer, and wherein said operating means comprises a circuit which polls said battery, recurring at a regular interval of time, during the "off" state of operation of the portable computer in order to determine the charge levels of said battery.

5. The portable computer of claim 4, further comprising an input device and an output device, wherein the portable computer is positionable between an open condition in which the input device and the output device are exposed to a user of the portable computer, and a closed condition in which the input device and the output device is protectively stowed within the portable computer, and further wherein said display is visible to the user when the portable computer is positioned in the open condition and in the closed condition.

6. The portable computer of claim 4, wherein the battery is discharging when the portable computer is in the "off" state of operation.

7. A method for displaying a charge level of a battery which is coupled to an electronic device to power operation of the electronic device, comprising the steps of:

displaying the charge level of the battery when the electronic device is in an "on" state of operation; and displaying the charge level of the battery when the electronic device is in an "off" state of operation, wherein the "off" state displaying step comprises the step of displaying the charge level of the battery during the entire "off" state of operation of the electronic device, wherein the "off" state displaying step further comprises the step of polling the battery, which recurs at a regular interval of time, during the "off" state of operation of the electronic device in order to determine the charge level of the battery.

8. The method of claim 7, wherein the electronic device is a portable computer which has an input device and an output device, and wherein the portable computer is positionable between an open condition in which the input device and the output device are exposed to a user of the portable computer, and a closed condition in which the input device and the output device is protectively stowed within the portable computer, and further wherein said display is visible to the user when the portable computer is positioned in the open condition and in the closed condition.

9. The method of claim 7, wherein the "off" state displaying step occurs during battery discharging.

10. A battery charge level indicator that displays a charge level of a battery which is coupled to an electronic device to power operation of the electronic device, comprising:

a display for indicating the charge level of the battery; and means for operating said display when the electronic device is in an "on" state of operation and in an "off" state of operation, wherein said operating means comprises a microprocessor which polls said battery, recurring at a regular interval of time, during the "off" state of operation of the electronic device in order to determine the charge level of said battery.

11. The battery charge level indicator of claim 10, wherein the electronic device is a portable computer which has an input device and an output device, and wherein the portable computer is positionable between an open condition in which the input device and the output device are exposed to a user of the portable computer, and a closed condition in which the input device and the output device is protectively stowed within the portable computer, and further wherein said display is visible to the user when the portable computer is positioned in the open condition and in the closed condition.

12. The battery charge level indicator of claim 10, wherein the display continuously indicates the charge level during the entire "off" state of operation.

13. The battery charge level indicator of claim 12, wherein the battery is discharging when said device is in the "off" state of operation.

* * * * *